United States Patent [19]
Campbell, III

[11] 4,172,740
[45] * Oct. 30, 1979

[54] SOLAR ENERGY SYSTEM

[76] Inventor: William P. Campbell, III, 3310 Rowland Pl., NW., Washington, D.C. 20008

[*] Notice: The portion of the term of this patent subsequent to Mar. 28, 1995, has been disclaimed.

[21] Appl. No.: 890,935

[22] Filed: Mar. 28, 1978

Related U.S. Application Data

[63] Continuation-in-part of Ser. No. 644,159, Dec. 24, 1975, Pat. No. 4,081,289.

[51] Int. Cl.$^2$ ............... H01L 35/02; H01L 31/04; F24J 3/02
[52] U.S. Cl. ............... 136/206; 136/89 PC; 126/440; 126/441
[58] Field of Search ............... 136/206, 89 PC; 126/270, 271

[56] References Cited

U.S. PATENT DOCUMENTS

| | | | |
|---|---|---|---|
| 2,402,662 | 6/1946 | Ohl | 136/89 |
| 2,946,945 | 7/1960 | Regnier et al. | 320/2 |
| 2,989,575 | 6/1961 | Wallace, Jr. | 136/89 |
| 3,279,457 | 10/1966 | Kyryluk | 126/270 |
| 3,866,285 | 2/1975 | Clark | 29/157 R |
| 3,934,573 | 1/1976 | Dandini | 126/270 |
| 3,960,136 | 6/1976 | Moan et al. | 126/271 |
| 3,988,166 | 10/1976 | Beam | 136/89 |
| 3,990,914 | 11/1976 | Weinstein et al. | 136/89 |
| 4,081,289 | 3/1978 | Campbell | 126/271 |

*Primary Examiner*—Leland A. Sebastian
*Attorney, Agent, or Firm*—John S. Roberts, Jr.

[57] ABSTRACT

A system for extracting energy from the sun's rays including a bank of solar energy cells which generate electrical current when exposed to the rays of the sun, immersed in a bath of liquid formed to serve as a lens, concentrating the sun rays on the cells, and transmitting heat away from the cells. The cells are shaped so as to cause a trapping effect of radiation incident thereon. The improved solar converting unit additionally includes a method for preheating the interior thereof. The converting unit is preferably equipped with light gathering and focusing means thereby providing coherent optically output.

33 Claims, 13 Drawing Figures

SOLAR ENERGY SYSTEM

This is a continuation-in-part of Ser. No. 644,159 filed Dec. 24, 1975 now U.S. Pat. No. 4,081,289 entitled Solar Energy System.

BACKGROUND OF THE INVENTION

The continuing deteriorating condition of our planet's ecosphere caused primarily by the entropy of fossil fues for transportation, electrical production, heating and cooling, etc., and the ever increasing cost of these ancient hydrocarbons due to dwindling supplies, have made the search for new energy sources imperative for our future health and well being.

Solar energy for years has proved itself reliable, non-polluting, and abundant energy source capable of meeting our increasing energy needs for millenia. However, until recently, it has been little exploited due to the seeming abundance of low cost fossil fuels.

In addition to the economic problems, the slow development of solar generated energy can be attributed to the numerous technical problems with solar converting equipment; the need for recoating the infrared thermal conversion layer because of ultra-violet breakdown and oxidation; the need for a collector drain down system or anti-freeze; heat exchangers; the need for the separation of the fluid and potable water due to contamination; back-up auxiliary heating units; high quality insulation, prevention of convective and radiant heat loss through collector and storage system; the need for outside power necessary for pumps and controls, tracking motors, etc., and heat losses in transfer between the collector and storage. There is also the need for sufficient Delta-T on low solar output days to perform useful work.

The following disclosure will make apparent to those skilled in the art of a method for overcoming these problems with a new and novel means.

THE PRIOR ART STATEMENT

Applicant is aware of the following patents in the prior art: U.S. Pat. No. 4,026,267; Coleman U.S. Pat. No. 3,279,457; Kyryluk U.S. Pat. No. 2,989,575; Wallace U.S. Pat. No. 2,312,920; Litton U.S. Pat. No. 1,946,184; Abbot U.S. Pat. No. 1,855,815; Abbot These references represent the best known prior art known to the applicant. Of these the Coleman patent comtemplates the use of fiber optic material for the concentration of solar energy. However, it does not disclose the use of a vacuum for insulation or a method of liquid optical focusing. The Kyryluk patent discloses a spherical embodiment in FIG. 3 of a solar heat concentrator which, geometrically, similar to one embodiment of the applicant's invention; however, there is no intention of incorporating solar cells or a liquid within the sphere. The two Abbot patents disclose solar heaters utilizing glass envelopes around a heat absorbing tube. These references do not contemplate utilizing a liquid within the envelope. The Wallace and Litton patents relate to solar cells, the Litton patent specifically relating to cooling system or jacket for solar cells. The Litton patent does not contemplate the use of liquid coolant for focusing the sun's rays nor does it contemplate utilization of the coolant as a source of energy itself. Wallace is pertinent only in that it discloses in the embodiment of FIG. 8 thereof a spherical substrate for the solar cells. Other than the geometrical similarity, there is no further relevance of the Wallace reference to the present invention.

SUMMARY OF THE INVENTION

This invention relates to a novel system for extracting energy from the sun's rays, which utilizes the best technology of the prior art in such a way as to increase efficiency to that more nearly approximating the theoretical maximum levels of energy extractable from the sun's rays, surpassing that heretofore possible in the prior art.

This invention provides a system which utilizes the extractable electrical potential in the sun's rays in combination with the extractable thermal properties of the sun's rays. The inherent optical properties of the liquid or gas used to receive and transmit the heat energy generated by the system are utilized to focus the rays of the sun.

This invention also provides a system which increases the extractable electrical energy capability of prior art radiation cells by providing a means to concentrate the amount of sunlight impinging on the cell while, at the same time, providing means to preclude overheating of the cell, thereby eliminating the temperature limitation on prior art cells so that it may be operated at much higher energy input levels than heretofore possible.

The invention further provides a system for extracting thermal energy from the sun's rays in a far more efficient manner than the prior art by providing means to focus the sun's rays on the heat-absorbing portion of the panel, by forming the heattransmitting medium in a geometric configuration which will accomplish such focusing.

In a preferred embodiment, the invention comprises a transparent container configured as a body of rotation. Radiant energy converting cells are disposed in the container at the focal point of the body of rotation, for the direct extraction of electricity from the sun's rays. A thermal transfer medium filling the container focuses rays of the sun on the cells to increase efficiency and to extract and transmit heat from the cells. Means are provided to circulate this thermal transfer medium in the container and to transmit cold medium to the container and heated medium from the container.

Wave-like converter substrates increases the conversion of the sun's rays by causing light to reverberate before allowing it to re-emit. Therefore, a substantial portion of radiant incident on the surface has a reflected component that impinges on other portions of the surface.

Many of the embodiments herein disclosed are insulated with a vacuum system, preventing convective heat losses. Furthermore, due to the superiority of a vacuum cavity and the large collector mass, the need for anti-freeze or collector drain-down systems is eliminated. This solar converting model when incorporating heater means demonstrates a high level of simplicity by incorporating the back-up auxiliary heater within the collecting unit, making it a complete one unit system.

A unique aspect of several of the models discussed herein is by allowing the ultraviolet rays of the sun to pass through the stored water, an inherent property of sunlight produces a purifying effect. This effect has also been shown to break down many harmful chemicals commonly found in municipal water supplies. This, combined with the fact that antifreeze is not used in the system, removes the possibility of contamination (in fact, it leaves the water in a superior condition), thus removing the necessity for heat exchangers.

Another major problem encountered with all know solar collecting units is the photo and oxidation breakdown of the infrared converting coating. While no known substance can stand up to such conditions indefinitely, we have found that the use of multicoatings greatly extends its life. An example of such a coating would consist of layers of bonding material alternating with layers of infrared converting means (such as granular carbon, black nickel or the like) so as to produce multi-layered composition. Thus, with time, when one layer of bonding material breaks down, it releases the infrared converting material and exposes the underlying layers, permitting the unit to continue operation for a longer time.

In the preferred embodiment, the unit would contain radiation responsible means, such as photovoltaics, thermal electric, and the like, which produce an electric current when exposed to the rays of the sun. This electric current could then be made to perform useful work (powering tracking motors, sensors, etc.) necessary for the unit's function, and further providing electric energy for other uses as well.

Transfer medium may be provided for the circulation of an appropriate fluid electronic junction material required for the production of an electric output from a source such as, for example, photovoltaics. This action thereby extends the radiation ionic converter's life by cooling and replacing spent barrier material. Additionally, the surface electrode can be eliminated by using a fluid of a junction material with electric and thermal conductive properties.

Auxiliary heater means are submerged in the collector maintains a minimum collector temperature, allowing collection of useful energy on low solar output days when the traditional collector would not be able to function due to insufficient Delta-T.

As an example, let us say that on a given day of low solar output, a traditional collector raises its plate and collector fluid from 50° F. to 90° F.—a 40° rise in temperature, but since the storage system is at, let us say, 110° F., the system is unable to perform useful work this day. However, on this same day, our collector—due to the fact that the collector and storage system is maintained at 110° by the heater thermostat unit—is therefore able to raise its temperature to 125° with the available solar radiation, thereby performing useful work.

Among the leading types of devices for extracting energy from the sun's rays are solar heating panels which utilize the energy present in the infrared portion of the sun's rays to raise the temperature of a liquid such as water.

The prior art is replete with solar heat devices generally including means to focus the sun's rays through mirrors and reflecting bodies, and with heat absorption surfaces utilizing the energy in the infrared portion of the spectrum to maximum efficiency. These heat cells generally comprise a transparent surface with a black body heat absorption surface in parallel spaced relation thereto with the liquid to be heated transmitted between these surfaces in heat conductive tubing of copper, aluminum, or the like. The developments in these systems include means to move the panel or cell to track the sun and/or means to fucus the sun's rays on the panel through parabolic mirrors set up in appropriate relation to the panel.

The object of the apparatus described in the present application is to concentrate the sun's rays into an array of radiation responsive cells thereby increasing the cells output and decreasing their per watt cost. Furthermore, these cells due to the contours of their geography will, irregardless of what radiation responsive system is used, produce a substantial power increase may be obtained, compared to the power from the same linear area using the same material of standard design. Heat is then removed from the cell which can be made to do useful work or can be stored for later use.

This design allows the concentrated sunlight to pass first through the thermal transfer medium before it strikes the collecting material. This thereby transfers more heat to the fluid, regardless of what collecting material is used, because a portion of the radiation is converted to heat directly in the fluid itself before it hits the collecting surface.

Another very important prior art device for extracting energy from the sun's rays is the solar energy panel or cell which utilizes properties of material such as silicon, cadmium sulfide, or selenium which, when contacted by the sun's rays, emit electrons displaced by photons in the sun's rays to thereby generate electrical current. This type of device has found wide utility in present day industry, particularly in space where such cells power satellite systems of various types. A greater heat transfer of the cells is provided because thermal energy is being transferred to the fluid on both the front and rear sides of the converter substrate, doubling the area which already-by use of corrugated surfaces-contains greater collecting areas.

This vessel, containing the cell array and transfer fluid in a spherical or cylindrical shape, forms a focusing lens almost completely surrounded by an evacuated space and outer wall which eliminates convective heat loss.

A BRIEF DESCRIPTION OF THE DRAWINGS

Figure 1:
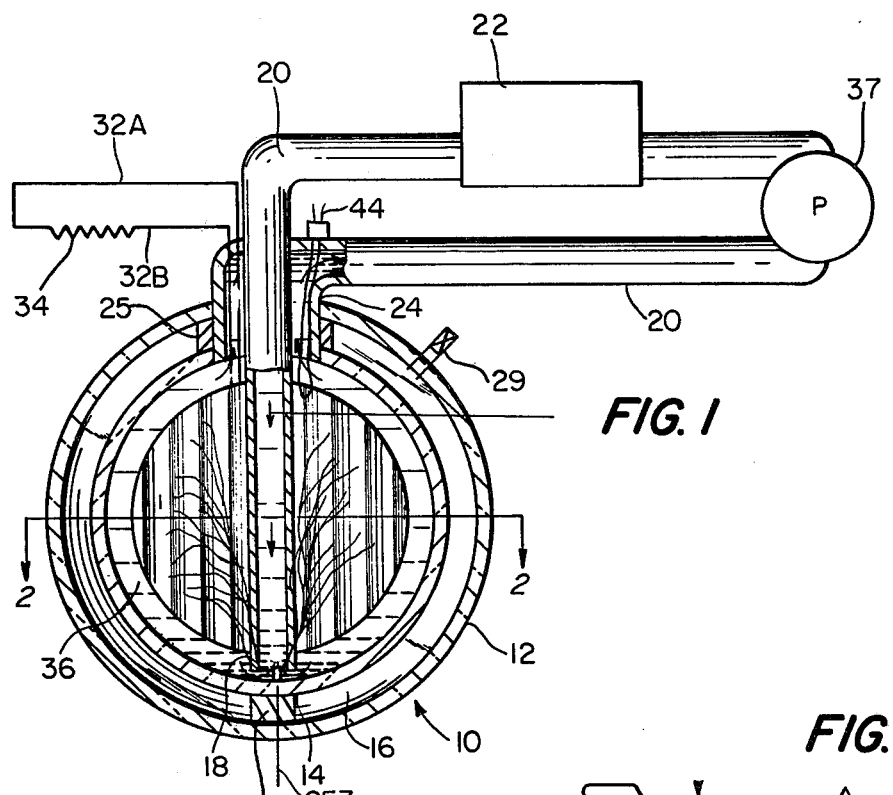
FIG. 1 is a sectional view in elevation of a device in accordance with the invention.
Figure 4:
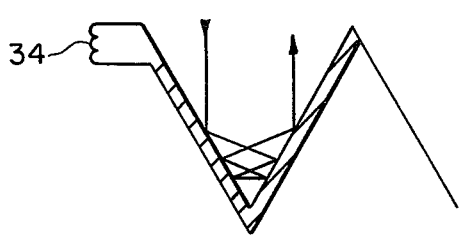
FIG. 4 shows a radiant energy electric converting cell with light trapping configurations.

The unit may further be equipped with an optional auxiliary heating means 44, which helps to maintain a more constant temperature, thereby overcoming many problems encountered with traditional concentrator systems. The auxiliary heating means additionally provides back-up heat for times of insufficient solar output, allowing the device to continue operations.

Another important feature of heat element 44 is the decreased amount of time necessary to bring the unit up to operating temperature by maintaining minimum temperature at times of inactivity. A problem with heliostat central collector units (to which this unit is most adaptable) of known art, is a tendency to degrade due to extreme fluctuations of temperature created by the magnification of a changeable light source, the sun. By maintaining minimum temperature heating element 44 is helpful with this problem, also, as it prevents the unit from flash heating from low temperature.

Furthermore, since the collecting means is immersed in the heat transfer medium, it has twice the surface area to remove heat from since it removes thermal energy from its front surface as well as the rear; the transferred medium therefore remains at substantially the same temperature on light exposed and shadowed sides of the collector, thereby preventing internal stresses from occurring.

With the aforementioned structure complete, the interior of the housing formed by the inner shell 14 is filled with a suitable transfer medium 36 such as, for example, water, xenon, gas or the like.

Pump means 37 are provided in the conduit 20 to circulate the Liquid 36 from the manifold 24 to the tube 18.

In operation, the device is exposed to the rays of the sun. The rays of the sun penetrate the transparent shells 12 and 14, and are focused by the transfer medium 36 within the inner shell onto the solar panels 26, whereupon radiant energy is converted and extracted from the device 10 through the leads 32A and 32B while thermal energy is extracted through manifold 24. The sun's rays impinging on the solar panels also raises the temperature thereof, thereby heating the interior of the shell 14. The insulation provided around the shell 14 by the evacuated space 16 holds the heat generated within the shell, thereby raising the temperature of the transfer medium 36. Circulation of the transfer medium by the pump means 37 provides withdrawal of heated transfer medium through manifold 24 from the top portion of the inner shell 14, and entry of cooled transfer medium through the manifold 24 via tube 18 to the bottom of the shell. Heat is removed from the circulated medium 26 by the load 22. The circulation of the medium thereby provides for removal of useful heat from the device 10 and, at the same time, for cooling of the solar cells 30. The presence of the transfer medium 36 within the inner shell 14 further provides for optical focusing of the sun's rays on the solar panel 26.

DISCLOSURE OF A PREFERRED EMBODIMENT

Figures 11A, 11B:
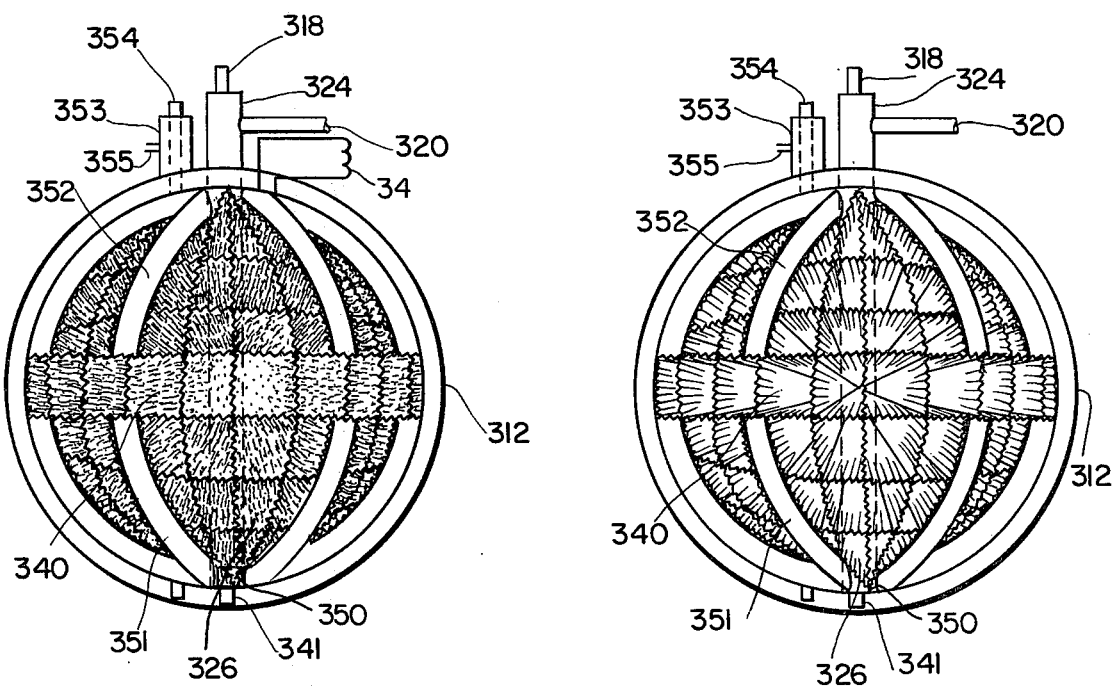
FIG. 11a shows an internally circulated solar converter with radiant energy electric converting means and light gathering and concentrating means.
FIG. 11b is the same device as 11a but without electric converting means and light gathering means.

The solar device shown in FIG. 11A and B is designed to incorporate all the radiation converting means as disclosed within this document. Resembling the unit in FIG. 1, this unit's main difference lies in the enclosure of the circulating means.

In operation cool liquid would enter unit along pipe 318 passing through center of manifold 324 extending up through the center at junction of panels 326. At manifold 350 fluid is subdivided into the appropriate number of conduits 351 corresponding to the number of panels 326. Along conduits 351 are spaced holes facing corrugated panels and situated so as to emit water to channel created by two corrugated panels laid together inversely and bonded.

Thermal conducting fluid convects upward in the interior of panel 326 to conduits 352 where fluid enters via spaced holes and culminates at manifold 324. Heated fluid is then removed from the unit via pipe 320.

Figure 6:
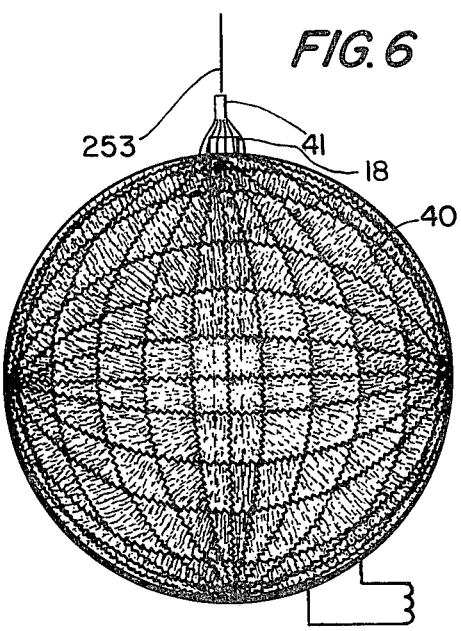
FIG. 6 shows an interchangeable module containing radiant energy electric converting cell with light gathering and concentrating means.

Fiber optic concentrated means 340 is similar in construction to the converting unit, as shown in FIG. 6. Fiber optic material extending out radially from the junctions of panels 326 where the fibers culminate and bend toward optical end piece 341. End piece 341 is clear or partially mirrorized to produce reverberation between it and the slightly more reflective coating at the other end of the fiber, thus producing a lasing effect. When adequately illuminated, a coherent beam will emerge from 341, which may then perform useful work. The unit as described is then complete, but may be enclosed within a transparent sperical container.

The container, depending on size, could be composed from geometric sections of a transparent spherical container. The interior of the sphere is either evacuated or filled with dry non-reactive gas or irradiant gas such as xenon. Optional manifold 353 can introduce, evacuate or circulate the atmosphere within the sphere through pipes 354 and 355. Should an irradiant gas such as xenon be within the sphere when a high intensity electro-magnetic beam enters (such as micro-wave), a brilliant flash would occur. This flash would pump the radiation converting means to high output levels. Further, the flash would pulse the fiber lasing means with which it is in intimate contact. In this manner the unit could continue to function in times of no light if it were illuminated by a microwave source. Such a source could be a geo-synchronous orbiting solar converting station transmitting converted energy in the form of microwaves to earth. Another source could be high altitude ballons with solar converting means transmitting energy in same manner.

The solar device as shown in FIG. 11B is constructed according to the device in FIG. 11A, but does not contain radiation converting means or fiber optic concentrators. It, therefore, functions as strictly a thermal unit.

While the invention has been herein shown and described in what is presently conceived to be the most practical and preferred embodiments thereof, it will be apparent to those of ordinary skill in the art that many modifications may be made thereof within the scope of the invention, which scope is to be accorded the broadest interpretation of the appended claims so as to encompass all equivalent structures and devices.

What is claimed is:

1. Solar radiation converting apparatus comprising solar radiation responsive means for transforming incident radiation into another energy form, a pair of spaced transparent housing members with complimentary curved surface, said members defining a fluid tight volume with said radiation responsive means within said volume, and means for circulating fluid into, through, and out said volume so that said solar radiation responsive means are cooled and said fluid is heated.

2. Apparatus as recited in claim 1 wherein said solar radiation responsive means comprise a central support, a plurality of surfaces extending generally radially out-

DESCRIPTION OF A PREFERRED EMBODIMENT

In FIG. 1 the device shown generally at 10, comprises a body of revolution defining a sphere. The device is formed of a pair of shells, outer shell 12 and inner shell 14, mounted in spaced relationship and affixed together to form a gas-tight space 16 therebetween. The space 16 is evacuated to provide an insulating medium between the shells 12 and 14 to insulate the interior of the container formed thereby. The shells 12 and 14 are formed of some transparent material such as, for example, glass or the like.

Figure 2:
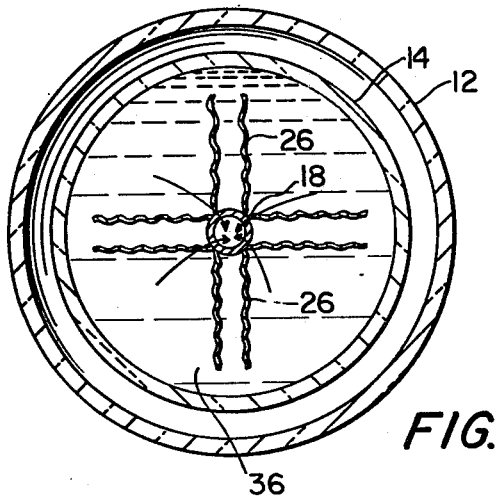
FIG. 2 is a sectional view of the embodiment of FIG. 1 taken along the line 22 thereof.

A central tube 18 is disposed along the axis of the housing formed by the shells 12 and 14, exiting at the top end thereof and connecting with a conduit 20 connected to some load 22 such as a storage device. The conduit 20 then returns to the device 10 entering the housing formed by the shells 12 and 14 in an outlet manifold 24, concentrically disposed with respect to the tube 18. As is best seen in FIG. 2, a series of corrugated panels, 26, preferably are mounted on the tube 18 extending radially therefrom toward the wall of the inner shell 14. Preferably occuring at about 30 intervals longitudinally and latitudinally, the panels 26 are semicircular in configuration and are sized to conform closely in spaced relationship to the inner surface of the shell 14. Exact angles and dimensions are not to be limited by the above descriptions.

Figure 3:
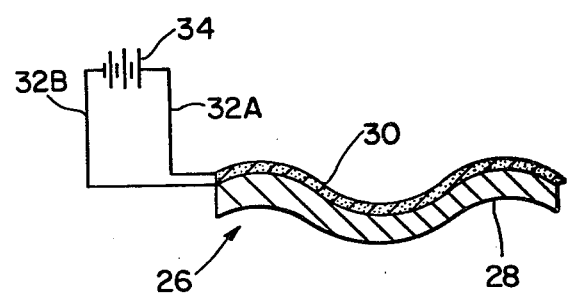
FIG. 3 is an enlarged fragmentary sectional view of a portion of the device of FIG. 1.

As is best seen in FIG. 3, the panels indicated generally there at 26 are composed of a corrugated substrate 28 of some suitable material such as aluminum, glass, plastic, or the like. Superimposed on the substrate 28 are radiant energy converting means 30, composed of a suitable material, such as, for example, selenium, silicon, infrared converting means of the like, as is well known in the art of solar cell, thermo-electric and solar energy conversion. The cell 30 is preferably composed of radiation converting means in corrugated sheet form and adhered to the substrate 28. Electrical leads 32A and 32B are connected to the cell 30 and to and electrical load 34, for example, a storage battery of the like. However, solar cells are not necessary to the function of the device is strictly a thermal unit.

Shown in FIGS. 5, 6, 7, 8, 9, and 10 are means for modifying the energy output of the unit with interchangable modular radiant converting means.

Figure 5:
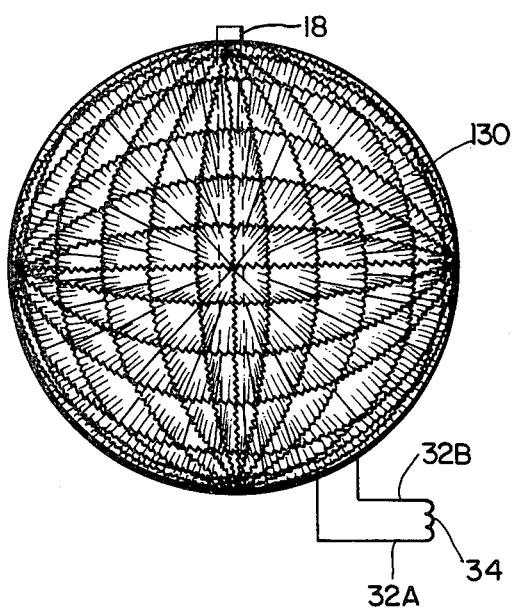
FIG. 5 illustrates an interchangeable module containing radiant energy electric converting cells.

FIG. 5 shows the interchangeable module consisting of a ridged, corrugated panel substrate 39 (preferably with thirty degree corrugations) which extends out radially from its core, preferably at about 30 degree opening intervals intersecting lonigudinally and latitudinally. Upon substrate 39 is disposed electric conversion cells 130, which may be photovoltaic, theroelectric or the like. these cells generate an electric current when exposed to a radiant light source.

Research has shown there to be no known body which can absorb and convert a radiant light source completely. The present invention therefore focuses on methods of trapping light by causing it to reverberate, thus converting a greater amount of energy with every successive reverberation. A wave form with about 30° intervals to that approximating a sine wave produces this desired reverberation of light and is thereby used extensively in the apparatus herein disclosed.

Figure 12:
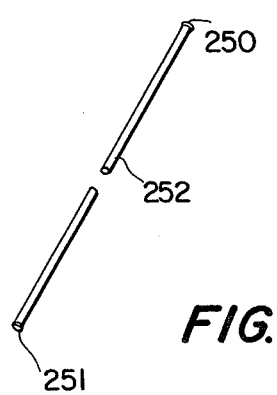
FIG. 12 shows a fiber optic lasing element.

FIG. 6 shows another module construction as FIG. 5, but additionally equipped with light gathering and concentrating means shown generally at 40. This device permits the gathering of and focusing of light through the use of fiber optics material, which extend out radially from the unit so as to accomplish 360° collection. Light is then channelled through the fiber optic material to optic boule 41, where all fibers converge, the ends of 41 being polished as well as the extreme ends of 40. Another construction would employ partial mirror coatings on the ends of fiber means 252 as is shown in FIG. 12. Being less reflective coating 251 at 41 will thereby emit radiation more readily than at the end 250 at 40. When adequately illuminated the fiber means 252 will produce a lasing effect 253, thus permitting the unit to have electrical, thermal, and optical outputs.

Figure 7:
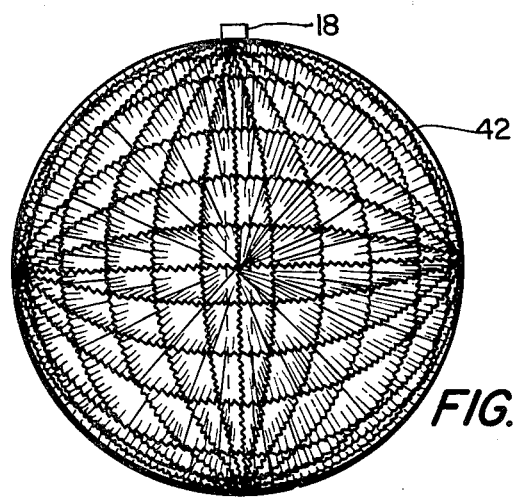
FIG. 7 illustrates an interchangeable module incorporating infrared converting means.

FIG. 7 is a module constructed as is shown in FIG. 5; however, the apparatus in FIG. 7 contains no electric converting means and is instead coated with infrared reconverting material 42, and functions strictly on a thermal basis.

Figure 8:
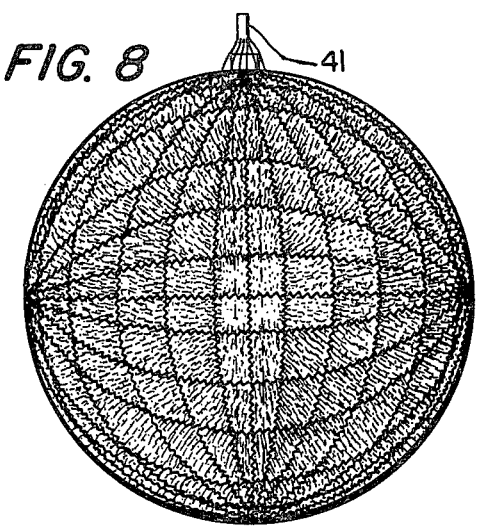
FIG. 8 shows an interchangeable infrared converting module with light gathering and concentrating means.

The apparatus in FIG. 8 shows a design similar to FIGS. 6 and 7, wherein the thermal and optical properties of sunlight are used as herein disclosed, but no electricity is produced within the unit.

Figure 9:
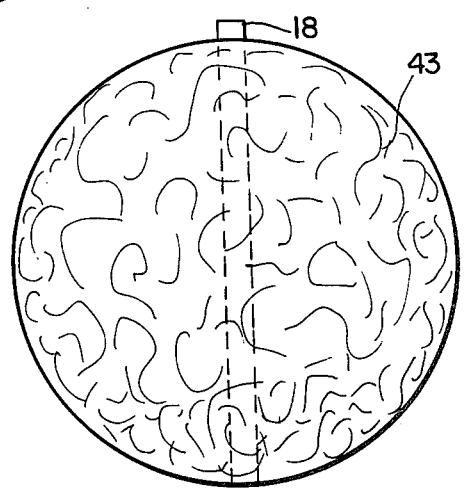
FIG. 9 shows an interchangeable infrared converting module additionally reducing convective circulation.

FIG. 9 shows infrared converting material 43 resembling wadded cottom or insulating material, with infrared converting coating. Material converts radiant energy into useful thermal energy, and also helps to retain heat by decreasing internal convective circulation.

Figure 10:
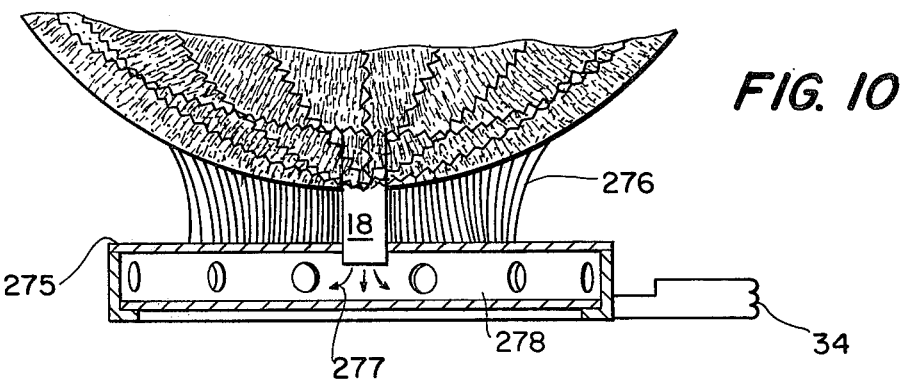
FIG. 10 shows an interchangeable module with a radiant electric cell and fiber optic concentrating means.

The embodiment shown in FIG. 10 provides apparatus to channel high concentrations of radiation as herein disclosed to the surface of a radiation conversion cell 278 for the purpose of increased extraction of electricity or other useful energies. In operation radiant energy is transmitted to transparent manifold brackets 275 by fiber optic means 276 in the manner herein disclosed.

Manifold 25 maintains a certain distance between the fiber optic means thereby permitting the circulation of thermal transfer fluid across its surface from inlet junction 18.

Concentrated radiation from fiber optic means passes through the transparent bracket and transfer medium striking the radiation converting means, such as, for example, photovoltaics, thermoelectrics and the like, thereby producing useful extractable energy.

Circulating thermal transfer medium may consist of any suitable substance, but preferably contains fluid electronic junctions with electrically conducting mean 277 thereby provides the means for replacement of spent junction material and elimination of the surface electrode when the poles are suitably insulated. The circulating system also prevents the overheating of the cell thereby heating the medium which may then perform useful work.

Referring again to FIG. 1, it can be seen that the leads 32A and 32B are disposed proximate to the tube 18 to exit from the device 10 for connection to the load 34. The leads 32A and 32B are preferably connected through the medium of a bus or collector from each of the panels 26, as is well known in the electrical art.

Structural details of the device include an annular support 25 between the bottom of the shells, and a support 27 between the tops of the shells to transfer loads between the shells and increase the structural effeciency of the device. Support 27 is necessary only if the unit is to be reopened. Evacuation of the space between the shells may be accomplished through valve conduit 29, and may be repeated if need be due to opening of the device.

wardly from the central support, and means for detachably mounting said central support within said volume.

3. Apparatus as recited in claim 2 wherein said surfaces each comprise photovoltalic material.

4. Apparatus as recited in claim 3 wherein said surfaces are corrugated.

5. Apparatus as recited in claim 2 wherein said surfaces each comprise thermo-electric material.

6. Apparatus as recited in claim 5 wherein said surfaces are corrugated.

7. Apparatus as recited in claim 1 wherein accessory heating means disposed within said volume in heat-transferring relationship with fluid within said volume.

8. Apparatus for conversion of solar radiaion, comprising a solar radiation responsive surface for transforming incident radiation into solar energy form, and means attached to said surface for polarizing and magnifying radiation incident upon said means, and transmitting coherent polarized, magnified radiation to said surface.

9. Apparatus as recited in claim 8 wherein said means attached to said surface comprise a plurality of radiation confucting fibers extending outwardly from said surface.

10. Apparatus as recited in claim 9 wherein each fiber has one end thereof attached to said surface and a free end thereof remote from said surface, and wherein said free end has a higher reflective index then said attached end.

11. Apparatus as recited in claim 8 wherein said fibers are of clear fiber optic material.

12. Apparatus as recited in claim 11 wherein said fiber optic material is selected from the group consisting of saphires and rubies.

13. Apparatus as recited in claim 8 further comprising a housing containing said surface, said housing comprising spaced transparent housing members with irradiant gas disposed therebetween.

14. Solar radiation converting apparatus comprising a a solar radiation responsive surface for transforming incident radiation into another energy form, and means associated with said surface for trapping radiation incident upon said surface so that a substantial portion of radiation incident upon said surface has a reflected component thereof that impinges upon other portions of said surface.

15. Apparatus as recited in claim 14 wherein said radiation trapping means comprise regular surface manifestations formed on said surface.

16. Apparatus as recited in claim 15 wherein said regular surface manifestations comprise corrugations.

17. Apparatus as recited in claim 16 wherein said corrugations approximate a sine wave.

18. Apparatus as recited in claim 16 wherein said corrugations include peaks, valleys, and connecting portions between said peaks and valleys, said connecting portions being generally planar and making an angle of about 30° with incident radiation.

19. Apparatus as recited in claim 14 further comprising a substrate for supporting said surface, integrally attached thereto and having substantially the same contour as said surface.

20. Apparatus as recited in claim 14 further comprising means attached to said surface for concentrating radiation incident upon said means onto said surface.

21. Apparatus as recited in claim 20 wherein said concentrating means comprises a plurality of radiation conducting fibers extending outwardly from said surface.

22. Apparatus as recited in claim 21 wherein said fibers have the end thereof remote from said surface mirrored.

23. Apparatus as recited in claim 14 further comprising means attached to said surface for polarizing and magnifying radiation incident upon said means and transmitting the coherent, polarized, magnified radiation to said surface.

24. Apparatus as recited in claim 14 wherein said surface consists of photovoltaic material.

25. Apparatus as recited in claim 14 wherein said surface consists of thermoelectric material.

26. Apparatus for conversion of solar radiaion, comprising a solar radiation responsive surface for transforming incident radiation into another energy form, and means attached to said surface for polarizing and magnifying radiation incident upon said means, and transmitting coherent polarized, magnified radiation to said surface.

27. Apparatus as recited in claim 26 wherein said means attached to said surface comprise a plurality of radiation conducting fibers extending outwardly from said surface.

28. Apparatus as recited in claim 27 wherein each fiber has one end thereof attached to said surface and a free end thereof remote from said surface, and wherein said free end has a higher reflective index than said attached end.

29. Apparatus as recited in claim 26 wherein said fibers of clear fiber optic material.

30. Apparatus as recited in claim 29 where in said fiber optic material is selected from the group consisting of sapphires and rubies.

31. Apparatus as recited in claim 14 wherein said surface consists of photovoltaic material.

32. Apparatus as recited in claim 26 further comprising a housing containing said surface, said housing comprising spaced transparent housing members with irradiant gas disposed therebetween.

33. Apparatus as recited in claim 14 further comprising a housing containing said surface, said housing comprising spaced transparent housing members with irradiant gas disposed therebetween.

* * * * *